United States Patent
Ferguson et al.

(10) Patent No.: US 11,429,887 B2
(45) Date of Patent: Aug. 30, 2022

(54) TUNABLE CURRENT-MIRROR QUBIT SYSTEM

(71) Applicants: David George Ferguson, Takoma Park, MD (US); Cheong Yiu Li, Batavia, IL (US); Jens Koch, Evanston, IL (US); Moe Shwan Khalil, Baltimore, MD (US)

(72) Inventors: David George Ferguson, Takoma Park, MD (US); Cheong Yiu Li, Batavia, IL (US); Jens Koch, Evanston, IL (US); Moe Shwan Khalil, Baltimore, MD (US)

(73) Assignees: NORTHROP GRUMMAN SYSTEMS CORPORATION, Falls Church, VA (US); NORTHWESTERN UNIVERSITY, Evanston, IL (US)

( * ) Notice: Subject to any disclaimer, the term of this patent is extended or adjusted under 35 U.S.C. 154(b) by 852 days.

(21) Appl. No.: 16/290,324

(22) Filed: Mar. 1, 2019

(65) Prior Publication Data
US 2020/0279186 A1 Sep. 3, 2020

(51) Int. Cl.
*G06N 10/00* (2022.01)
*G01R 33/035* (2006.01)
(Continued)

(52) U.S. Cl.
CPC .............. *G06N 10/00* (2019.01); *B82Y 10/00* (2013.01); *G01R 33/0354* (2013.01); *G01R 33/0358* (2013.01); *H01L 39/223* (2013.01)

(58) Field of Classification Search
CPC .. G06N 10/00; G06N 99/002; G01R 33/0354; G01R 33/0358; H01L 39/223; B82Y 10/00
(Continued)

(56) References Cited

U.S. PATENT DOCUMENTS

| 3,758,795 A | 9/1973 | Anacker et al. |
| 7,858,966 B2 | 12/2010 | Kitaev |

(Continued)

OTHER PUBLICATIONS

De, Topological aspects of two-dimensional quantum systems, Univ of Leeds, submitted Sep. 2014 (Year: 2014).*
(Continued)

*Primary Examiner* — Arnold M Kinkead
(74) *Attorney, Agent, or Firm* — Tarolli, Sundheim, Covell & Tummino LLP (57) ABSTRACT

One example includes a tunable current-mirror qubit. The qubit includes a plurality of flux tunable elements disposed in a circuit loop. A first portion of the flux tunable elements can be configured to receive a first input flux and a remaining portion of the flux tunable elements can be configured to receive a second input flux to control a mode of the tunable current-mirror qubit between a microwave excitation mode to facilitate excitation or quantum state manipulation of the tunable current-mirror qubit via a microwave input signal and a noise-protected mode to facilitate storage of the quantum state of the tunable current-mirror qubit. The qubit also includes at least one capacitor interconnecting nodes between respective pairs of the flux tunable elements to facilitate formation of Cooper-pair excitons in each of the microwave excitation mode and the noise-protected mode.

19 Claims, 3 Drawing Sheets

(51) Int. Cl.
  *H01L 39/22* (2006.01)
  *B82Y 10/00* (2011.01)
(58) Field of Classification Search
  USPC ........ 977/933, 902; 257/36; 385/37; 706/15; 326/1
  See application file for complete search history.

(56) References Cited

U.S. PATENT DOCUMENTS

| | | |
|---|---|---|
| 2002/0188578 A1 | 12/2002 | Amin et al. |
| 2003/0207766 A1 | 11/2003 | Esteve et al. |
| 2004/0173793 A1 | 9/2004 | Blais et al. |
| 2006/0147154 A1 | 7/2006 | Thom et al. |
| 2009/0289638 A1 | 11/2009 | Farinelli et al. |

OTHER PUBLICATIONS

Gu et al, Microwave photonics with superconducting quantum circuits, Physics Reports, vol. 718-719, Nov. 30, 2017 pp. 1-102 (Year: 2017).*
International Search Report for International Application No. PCT/US2020/016620 dated Jun. 9, 2020.
Sergey Gladchenko et al: "Superconducting nanocircuits for topologically protected qubits", Nature Physics, vol. 5, No. 1, 2009, pp. 48-53, XP055697467, GB ISSN: 1745-2473, DOI: 10.1038/nphys1151 abstract; p. 48-p. 52; figures 1, 2.
Doua Otb et al: "Key Issues Reviews;Physical implementation of protected Qubits;Physical implementation of protected qubits", Reports on Progress in Physics, Institute of Physics Publishing, Bristol, GB, vol. 75, No. 7, Jun. 28, 2012 (Jun. 28, 2012), p. 72001, XP020225209, ISSN: 0034-4885, DOI: 10.1088/0034-4885/75/7/072001 abstract; Sections 1, 4, 5, and 6; figure 8.
Alexei Kitaev: 11 Protected qubit based on a superconducting current mirror 11 , arxiv .org, Cornell University Li bra ry, 201 Olin Library Cornell University Ithaca, NY 14853, Sep. 19, 2006 (Sep. 19, 2006), XP080251290, p. 1-p. 6.
Anonymous: 11 Kitaev 1s scheme for a protected qubit in a circuit 11, 2' 008, XP055696835, Retrieved from the Internet: URL:http://theory.caltech.edu/- reskill/papers/Kitaev-superconducting-qubit.pdf [retrieved on May 19, 2020] p. 1-p. 13.
Extended Search Report for corresponding EP 11 76 6454 dated Mar. 29, 2017.
International Search Report for corresponding PCT/US11/30304 dated May 18, 2011.
Sillanpaa, et al, "Coherent Quantum State Storage and Transfer Between Two Phase Qubits Via a Resonant Cavity"; Nature 449. Dec. 27, 2007, p. 438-442, retrieved on May 18, 2011, Retrieved from URL: arxiv.org/PS_cache/arxif/pdf/0709/0709.2341v1.pdf: p. 2, paragraph 2; p. 3, paragraph 2 and 3; p. 14, paragraph 1.

* cited by examiner

TUNABLE CURRENT-MIRROR QUBIT SYSTEM

GOVERNMENT INTEREST

The invention was made under Government Contract Number W911NF-17-C-0024. Therefore, the US Government has rights to the invention as specified in that contract.

TECHNICAL FIELD

This disclosure relates generally to quantum and classical computing systems, and more specifically to a tunable current-mirror qubit system.

BACKGROUND

Quantum computers implement devices called qubits to provide manipulation of data, such as based on superpositions of quantum states. One characteristic of qubits is their coherence, which can directly impact the fidelity with which a computer can implement a quantum operation. Qubit coherence can be affected by certain factors, such as the amplitude of the environmental noise that is coupled to the qubit, and the sensitivity of the qubit to the noise. As an example, the sensitivity to noise can be quantified as how a qubit's current or voltage operators shifts and couples the quantum states of the qubit. The magnitude of these shifts and couplings can be described as the magnitude of three Pauli operators X, Y and Z acting on the quantum state, and will be referred to as Pauli dipoles. For example, for solid state qubits, dielectric noise can be one of the primary sources of environmental noise. Conventional qubit designs can be sensitive to decoherence channels such as dielectric loss or flux noise, which can be another ubiquitous noise type in solid state systems.

SUMMARY

One example includes a tunable current-mirror qubit. The qubit includes a plurality of flux tunable elements disposed in a circuit loop. A first portion of the flux tunable elements can be configured to receive a first input flux and a remaining portion of the flux tunable elements can be configured to receive a second input flux to control a mode of the tunable current-mirror qubit between a microwave excitation mode to facilitate excitation or quantum state manipulation of the tunable current-mirror qubit via a microwave input signal and a noise-protected mode to facilitate storage of the quantum state of the tunable current-mirror qubit. The qubit also includes at least one capacitor interconnecting nodes between respective pairs of the flux tunable elements to facilitate formation of Cooper-pair excitons in each of the microwave excitation mode and the noise-protected mode.

Another example includes a method for controlling a tunable current-mirror qubit. The method includes providing excitation to the tunable current-mirror qubit via a microwave signal in a microwave excitation mode of the tunable current-mirror qubit to provide manipulation of a quantum state of the tunable current-mirror qubit. The method also includes providing a first input flux to a first flux tunable element of a plurality of flux tunable elements disposed in a circuit loop of the tunable current-mirror qubit. The tunable current-mirror qubit further comprises at least one capacitor interconnecting nodes between respective pairs of the flux tunable elements to facilitate formation of Cooper-pair excitons that delocalize about the circuit loop. The method also includes adiabatically increasing the first input flux to a first amplitude and providing a second input flux to a remaining at least one of the plurality of flux tunable elements. The method further includes adiabatically increasing the first input flux from the first amplitude to a second amplitude and adiabatically increasing the second input flux from approximately zero amplitude to a first amplitude to set the tunable current-mirror qubit to a noise-protected mode to store the quantum state of the tunable current-mirror qubit.

Another example includes a tunable current-mirror qubit system. The system includes a first flux source that is controlled to provide a first input flux, a second flux source that is controlled to provide a second input flux, and a third flux source that is controlled to provide a third input flux. The system also includes a tunable current-mirror qubit. The qubit includes a plurality of superconducting quantum interference devices (SQUIDs) disposed in a circuit loop that is arranged as a Mobius loop and is configured to receive the third input flux, a first portion of the SQUIDs being configured to receive the first input flux and a remaining portion of the SQUIDs being configured to receive the second input flux, wherein the first, second, and third input fluxes are provided to control the mode of the tunable current-mirror qubit between a microwave excitation mode to facilitate excitation and quantum state manipulation of the tunable current-mirror qubit via a microwave input signal and a noise-protected mode to facilitate storage of the quantum state of the tunable current-mirror qubit. The qubit further includes at least one capacitor interconnecting nodes between respective pairs of the SQUIDs to facilitate formation of Cooper-pair excitons that delocalize about the circuit loop in each of the microwave excitation mode and the noise-protected mode.

DETAILED DESCRIPTION

This disclosure relates generally to quantum and classical computing systems, and more specifically to a tunable current-mirror qubit system. The tunable current-mirror qubit system can be implemented for quantum operations in a quantum computer system. The tunable current-mirror qubit system can include a tunable current-mirror qubit and a plurality of flux sources that can be independently controlled to provide input fluxes to the tunable current-mirror qubit. The tunable current-mirror qubit can include a plurality of flux tunable elements, which can be arranged to act as superconducting quantum interference devices (SQUIDs) that can be arranged about a circuit loop and can be configured to receive two of the plurality of input fluxes. As an example, the circuit loop can be configured as a Mobius loop with respect to the flux tunable elements. For example, a first portion (e.g., a single one) of the flux tunable elements can be configured to receive a first input flux while the remaining at least one of the flux tunable elements can receive a second input flux. Additionally, the circuit loop can be configured to receive a third input flux. The tunable current-mirror qubit can also include at least one capacitor that can interconnect nodes between respective pairs of the flux tunable elements, such that the capacitors can facilitate correlated motion of Cooper pairs about the circuit loop of the tunable current-mirror qubit.

The input fluxes can be independently controlled to allow the tunable current-mirror qubit to transition between at least two modes of the tunable current-mirror qubit. In a microwave excitation mode of the tunable current-mirror qubit, the quantum state of the tunable current-mirror qubit can be manipulated via a resonant microwave signal, and can thus generate quantum superpositions to be stored in the tunable current-mirror qubit. By manipulating the input fluxes, the tunable current-mirror qubit can be set to a noise-protected mode in which the quantum state can be stored in the tunable current-mirror qubit in a manner that is substantially insensitive to noise.

For example, the first input flux can be provided and adiabatically increased while the second input flux is deactivated and the third input flux is provided (e.g., at a static amplitude) to change the tunable current-mirror qubit from the microwave excitation mode to a persistent current mode at which the ground and excited microwave states adiabatically changes to a right rotating current state and a left rotating current state about the tunable current-mirror qubit. As another example, the third input flux can be deactivated while the first and second input fluxes are adiabatically increased to change the tunable current-mirror qubit from the persistent current mode to the noise-protected mode during which charge fluctuations primarily occur as Cooper excitons, and the method of exciton current rotation of Cooper excitons about the circuit loop provides for noise to affect the quantum states of tunable current-mirror qubit approximately equally and oppositely, thus reducing sensitivity of the qubit states to noise. As described herein, Cooper excitons can correspond to Cooper pair charge excitations where equal magnitude and opposite charge occur on respective sides of the capacitors about the tunable current-mirror qubit. Accordingly, the excitation can be stored in the tunable current-mirror qubit in a manner that is substantially insensitive to noise. The input fluxes can thus be controlled in a reverse order to return the tunable current-mirror qubit to the microwave excitation mode to facilitate readout of the excitation of the tunable current-mirror qubit.

Figure 1:
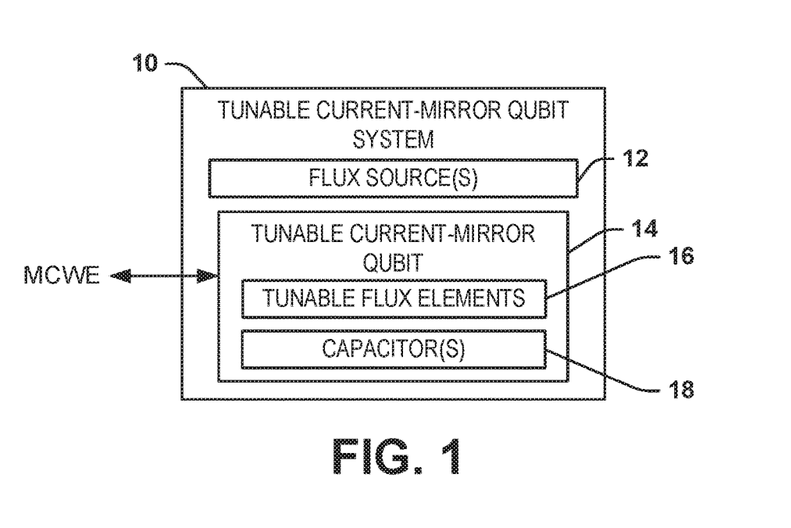
FIG. 1 illustrates an example of a tunable current-mirror qubit system.

FIG. 1 illustrates an example of a tunable current-mirror qubit system 10. The tunable current-mirror qubit system 10 can be implemented in a quantum computer system to manipulate and store quantum data in the quantum computer system.

The tunable current-mirror qubit system 10 includes a plurality of flux sources 12 and a tunable current-mirror qubit 14. The flux sources 12 can correspond to any of a variety of circuit devices and elements that can provide magnetic flux, such as current-carrying inductors. In the example of FIG. 1, the tunable current-mirror qubit 14 includes a plurality of flux tunable elements 16 and at least one capacitor 18. As described in greater detail herein, the flux tunable elements 16 can be arranged about a circuit loop, which can be arranged as a Mobius loop, and the at least one capacitor 18 can be arranged to interconnect nodes between respective pairs of flux tunable elements 16. As an example, the flux tunable elements 16 can be arranged as superconducting quantum interference devices (SQUIDs) that are disposed about the circuit loop.

The flux sources 12 can be independently controlled to provide input fluxes to the tunable current-mirror qubit 14. For example, a first portion (e.g., a single one) of the flux tunable elements 16 can be configured to receive a first input flux provided from the flux sources 12 while the remaining at least one of the flux tunable elements 16 can receive a second input flux from the flux sources 12. Additionally, the circuit loop about which the flux tunable elements 16 are arranged can be configured to receive a third input flux from the flux sources 12. The flux sources 12 can be independently controlled to provide the input fluxes in a manner to allow the tunable current-mirror qubit 14 to transition between at least two modes. The states can correspond to different manners in which Cooper pairs are correlated on opposite ends of the capacitor(s) 18.

The first mode corresponds to a microwave excitation mode in which the quantum state of the tunable current-mirror qubit 14 can be manipulated via a microwave signal, demonstrated in the example of FIG. 1 as a signal MCWE. Therefore, the microwave excitation signal MCWE can be used to create quantum superpositions stored in the tunable current-mirror qubit 14. A second mode corresponds to a noise-protected mode in which the established quantum state can be stored in the tunable current-mirror qubit 14 in a manner that is substantially insensitive to noise, thus providing strong coherence of the tunable current-mirror qubit 14. By manipulating the input fluxes provided from the flux sources 12, the tunable current-mirror qubit 14 can be controlled to transition between the first and second modes.

As an example, the input fluxes can be provided from the flux sources 12 to switch between first and second modes via an intermediate state corresponding to a persistent current mode at which the ground and excited microwave states changes to rotating current states about the tunable current-mirror qubit 14. For example, the first input flux can be provided and adiabatically increased (e.g., from approximately zero amplitude to a first amplitude) while the second input flux is deactivated and the third input flux is provided (e.g., at a static amplitude) to change the tunable current-mirror qubit 14 from the microwave excitation mode excitation mode to the persistent current mode. As another example, the third input flux can be deactivated while the first and second input fluxes are adiabatically increased to change the tunable current-mirror qubit 14 from the persistent current mode to the noise-protected mode in which rotation of Cooper-pair exciton current about the circuit loop provide for noise to affect the tunable current-mirror qubit 14 quantum states approximately equally and oppositely. For example, the first input flux can be adiabatically increased from the first amplitude to a second amplitude and the second input flux can be adiabatically increased from approximately zero amplitude to a first amplitude (which may be different from the first amplitude of the first input flux). Accordingly, the quantum state generated by microwave excitation MCWE can be stored in the tunable current-mirror qubit 14 in a manner that is substantially insensitive to noise, thus providing strong coherence of the tunable current-mirror qubit 14.

As an example, the input fluxes can thus be controlled in a reverse order manner to return the tunable current-mirror qubit to the microwave excitation mode to facilitate readout of the quantum state of the tunable current-mirror qubit 14. For example, the third input flux can remain deactivated while the first and second input fluxes are adiabatically decreased to change the tunable current-mirror qubit 14 from the noise-protected mode to the persistent current mode. For example, the first input flux can be adiabatically decreased from the second amplitude to the first amplitude and the second input flux can be decreased from the first amplitude to approximately zero amplitude. As another example, the third input flux can be reactivated, the second input flux can be deactivated, and the first input flux is adiabatically decreased to change the tunable current-mirror qubit 14 from the persistent current mode back to the microwave excitation mode. The quantum state of the tunable current-mirror qubit 14 can then be readout using standard microwave readout techniques such as causing a dispersive shift to a readout resonator. Therefore, the microwave excitation MCWE can be readout from the tunable current-mirror qubit 14. Because the tunable current-mirror qubit 14 was prior set to the noise-protected mode, decay of the fidelity of the quantum state from the intended quantum state can be significantly mitigated. Accordingly, as described herein, the tunable current-mirror qubit system 10 can provide for storage of quantum states in a highly coherent manner relative to typical qubits.

Figure 2:
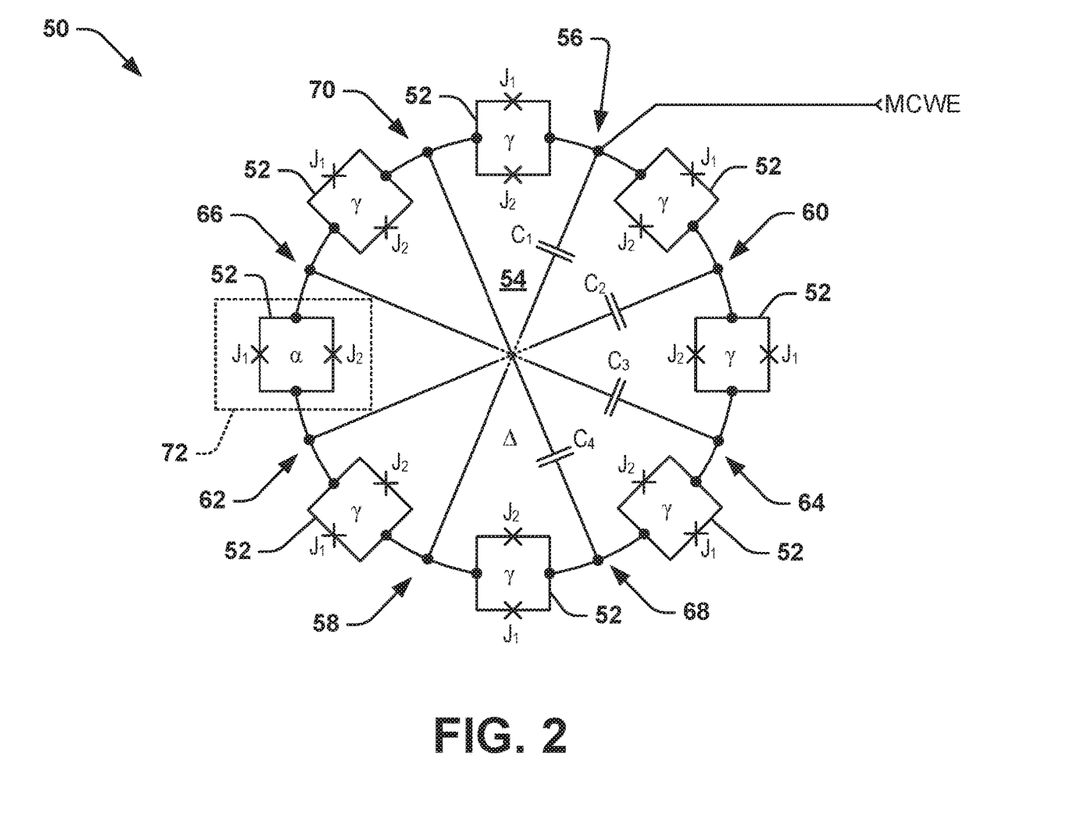
FIG. 2 illustrates an example of a circuit diagram of a tunable current-mirror qubit.

FIG. 2 illustrates an example of a tunable current-mirror qubit 50. The tunable current-mirror qubit 50 can be implemented in a quantum computer system to manipulate quantum data in the quantum computer system. For example, the tunable current-mirror qubit 50 can correspond to the tunable current-mirror qubit 14 in the example of FIG. 1. Therefore, reference is to be made to the example of FIG. 1 in the following description of the example of FIG. 2.

In the example of FIG. 2, the tunable current-mirror qubit 50 includes a plurality of SQUIDs 52, demonstrated as having a quantity of eight that are disposed about a circuit loop 54. The SQUIDs are each demonstrated as including a pair of parallel Josephson junctions $J_1$ and $J_2$. Additionally, the tunable current-mirror qubit 50 includes a plurality of capacitors, demonstrated in the example of FIG. 2 as $C_1$, $C_2$, $C_3$, and $C_4$, that interconnect nodes between respective pairs of SQUIDs 52. Particularly, in the example of FIG. 2, the capacitor $C_1$ interconnects nodes 56 and 58, the capacitor $C_2$ interconnects nodes 60 and 62, the capacitor $C_3$ interconnects nodes 64 and 66, and the capacitor $C_4$ interconnects nodes 68 and 70. In the example of FIG. 2, the capacitors $C_1$, $C_2$, $C_3$, and $C_4$ are not coupled to each other. The arrangement of the SQUIDs 52 and the capacitors $C_1$, $C_2$, $C_3$, and $C_4$ can thus correspond to a Mobius loop with respect to the motion of Cooper pairs, and thus Cooper excitons, about the circuit loop 52 and about opposite ends of the respective capacitors $C_1$, $C_2$, $C_3$, and $C_4$. As an example, the capacitors $C_1$, $C_2$, $C_3$, and $C_4$ can have a relatively large capacitance relative to the capacitance of the Josephson junctions (e.g., at least 50 femtofarads).

In the example of FIG. 2, a first one of the SQUIDs 52, demonstrated at 72, is configured to receive a first input flux α, while the remaining SQUIDs 52 are configured to receive a second input flux γ. For example, the input fluxes α and γ can be provided from separate flux sources 12 in the example of FIG. 1. Additionally, in the example of FIG. 2, the circuit loop 54 is provided a third input flux Δ from another flux source (e.g., another flux source 12). The input fluxes α, γ, and Δ can be independently controlled to control the mode of the tunable current-mirror qubit 50, such as to allow the tunable current-mirror qubit 50 to transition between at least two modes, as described herein. The states can correspond to different manners in which Cooper pairs are correlated on opposite ends of the capacitors $C_1$, $C_2$, $C_3$, and $C_4$.

The first mode corresponds to a microwave excitation mode in which the quantum state of the tunable current-mirror qubit 50 can be manipulated via a microwave signal, demonstrated in the example of FIG. 2 as a signal MCWE provided at the node 56. Therefore, the microwave excitation signal MCWE can be in resonance with the transition frequency of the tunable current-mirror qubit 50, and can thus create quantum superpositions stored in the tunable current-mirror qubit 50. A second mode corresponds to a noise-protected mode in which the quantum state can be stored in the tunable current-mirror qubit 50 in a manner that is substantially insensitive to noise, thus providing strong coherence of the tunable current-mirror qubit 50. By manipulating the input fluxes provided from the flux sources 52, the tunable current-mirror qubit 50 can be controlled to transition between the first and second modes, such as via an intermediate mode corresponding to a persistent current mode, as described previously in the example of FIG. 1.

For example, the first input flux α can be provided and adiabatically increased (e.g., from approximately zero amplitude to a first amplitude) while the input flux γ is deactivated and the third input flux Δ is provided (e.g., at a static amplitude) to change the tunable current-mirror qubit 50 from the microwave-excitation mode to the persistent current mode. As another example, the third input flux Δ can be deactivated while the first and second input fluxes α and γ are adiabatically increased to change the tunable current-mirror qubit 50 from the persistent current mode to the noise-protected mode, during which rotation of Cooper excitons current about the circuit loop provides for noise to affect the tunable current-mirror qubit 50 states approximately equally and oppositely. For example, the input flux α can be adiabatically increased from the first amplitude to a second amplitude and the input flux γ can be adiabatically increased from approximately zero amplitude to a first amplitude (which may be different from the first amplitude of the input flux α). Accordingly, the quantum state can be stored in the tunable current-mirror qubit 50 in a manner that is substantially insensitive to noise to provide strong coherence of the tunable current-mirror qubit 50.

As an example, the input fluxes can thus be controlled in a reverse order manner to return the tunable current-mirror qubit to the microwave excitation mode to facilitate readout of the quantum state of the tunable current-mirror qubit 50. For example, the third input flux Δ can remain deactivated while the first and second input fluxes α and γ are adiabatically decreased to change the tunable current-mirror qubit 50 from the noise-protected mode to the persistent current mode. For example, the input flux α can be adiabatically decreased from the second amplitude to the first amplitude and the input flux γ can be decreased from the first amplitude to approximately zero amplitude. As another example, the third input flux Δ can be reactivated, the input flux γ can be deactivated, and the input flux α is adiabatically decreased to change the tunable current-mirror qubit 50 from the persistent current mode back to the microwave excitation mode. Therefore, the quantum state can be readout from the tunable current-mirror qubit 50. Because the tunable current-mirror qubit 50 was prior set to the noise-protected mode, decay of the quantum state can be significantly mitigated. Accordingly, as described herein, the tunable current-mirror qubit 50 can provide for storage of quantum states in a highly coherent manner relative to typical qubits.

For example, for conventional Josephson circuits, the low-energy charge excitations are "charge 2e" Cooper pairs. Such charge excitations, e.g., the net number of Cooper pairs on each superconducting lead corresponding to the nodes 56, 58, 60, 62, 64, 66, 68, and 70, can be utilized to describe a basis for the quantum states of the tunable current-mirror qubit 50. As Cooper pairs move around the circuit loop 54, they can move about the nodes 56, 58, 60, 62, 64, 66, 68, and 70, but the total number of Cooper pairs is conserved. One of the distinguishing characteristics of the tunable current-mirror qubit 50 is it can operate in the regime where the capacitance of the capacitors $C_1$, $C_2$, $C_3$, and $C_4$, described generally as $C_B$, is much greater than a junction capacitance of the Josephson junctions $J_1$ and $J_2$, described generally as $C_J$, and much greater than a stray ground capacitance of the respective nodes 56, 58, 60, 62, 64, 66, 68, and 70, described generally as CG. In this regime the lowest-energy charge excitations are "Cooper-pair excitons", which are charge excitations that are comprised of a Cooper pair and a Cooper-pair hole on either side of a given one of the capacitors $C_1$, $C_2$, $C_3$, and $C_4$. Such Cooper-pair exciton excitations are only a subset of all possible charge excitations. The ability to have a low-energy regime described in terms of Cooper-pair excitons is a fundamental distinction of the tunable current-mirror qubit 50 from conventional superconducting circuits, and is an essential property that enables the unique noise immunity of the tunable current-mirror qubit 50, as described herein.

In the microwave excitation mode, the Josephson coupling energy between leads of the tunable current-mirror qubit 50 is tuned to be larger than the charging energy of the Josephson junctions $J_1$ and $J_2$ of each of the SQUIDs 52, which is the default approximately zero amplitude-field condition of the tunable current-mirror qubit 50. In the microwave excitation mode and the persistent current mode, Cooper pairs delocalize around the entire circuit loop 54. In the microwave excitation mode, the tunable current-mirror qubit 50 is encoded in the ground and first excited states of the lowest frequency microwave mode of the entire circuit loop 54. The manipulation of the quantum state in the microwave mode (e.g., provided by the microwave excitation MCWE) is implement by coupling to voltage operators of the qubit and can be utilized to prepare and readout the tunable current-mirror qubit 50 (e.g., by coherent microwave driving and dispersive readout). While there can be many modes of the tunable current-mirror qubit 50, in the microwave-excitation mode, the qubit mode can be isolated in frequency with well-defined mode structure of voltage and current fluctuations, such as by modestly decreasing the effective critical current of the CJJ 52 that receives the first input flux $\alpha$.

In the persistent current mode, the tunable current-mirror qubit 50 is encoded in circulating current states of the circuit loop 54. The two circulating current states associated with the persistent current mode can be distinguished by different changes in the superconducting phase $\delta\theta$ across each CJJ 52. For example, the difference $\delta\theta$ between the two circulating current states for each CJJ 52 can be approximately equal to $\pi/N_B$, where $N_B$ corresponds to the number of capacitors (e.g., four in the example of FIG. 2). The circulating current states can be labeled as $|0\rangle$ and $|\pi\rangle$. This difference in phase change across the SQUIDs 52 can lead to a Pauli dipole for the current operator describing current flowing in the circuit loop. For example, for one choice of basis, the two qubit states will have a difference in the quantum expectation value for charge current flowing in the circuit loop for each of the two qubit states.

In the noise-protected mode, the qubit encoding is different from either of the microwave excitation mode or the persistent current mode. In the noise-protected mode, the Josephson coupling between the leads is reduced to below the charging energy of the Josephson junctions $J_1$ and $J_2$. As a result, only Cooper-excitons substantially delocalize around the circuit loop 54. The Josephson junction coupling of Cooper pairs generates, via a second order process, a coupling between Cooper-pair excitons on neighboring capacitors of the capacitors $C_1$, $C_2$, $C_3$, and $C_4$. Since the capacitors $C_1$, $C_2$, $C_3$, and $C_4$ have such a large capacitance, the Cooper exciton hopping energy is larger than the exciton charging energy, causing the Cooper excitons delocalize around the circuit loop 54.

Cooper-pair excitons are fundamentally different than Cooper pairs in that, when they travel around a loop, they can arrive back as a negatively charged version of themselves based on the Mobius topological configuration of the tunable current-mirror qubit 50. Like Cooper pairs, the number of Cooper-pair excitons are locally conserved as they move from capacitor to capacitor of the capacitors $C_1$, $C_2$, $C_3$, and $C_4$. However when a Cooper exciton travels around the Mobius loop structure of the circuit loop 54 and arrives back as a negative exciton, it effectively changes the total number of Cooper-pair excitons by two. As such, the tunable current-mirror qubit 50 encodes the qubit state as $|+\rangle$ and $|-\rangle$ which corresponds to an even or odd number of Cooper-pair excitons, respectively. The symmetric and antisymmetric quantum superposition of these states is referred to as $|0\rangle \propto |+\rangle + |-\rangle$ and $|\pi\rangle \propto |+\rangle - |-\rangle$ states respectively.

In the noise-protected mode, where the Cooper-pair exciton hopping is large with respect to the charging energy of the capacitors, the Cooper-pair exciton number fluctuations become large and the energy of the $|+\rangle$ and $|-\rangle$ states (and thus the 0 and $\pi$ states) becomes nearly degenerate. In this regime, the magnitude of the Pauli dipoles of voltage and current operators become significantly suppressed, and thus the tunable current-mirror qubit 50 becomes protected from environmental noise. Therefore, when Cooper-pair excitons delocalize around the Mobius arrangement of the circuit loop 54 into a single delocalized quantum state, any local noise source that couples to voltage or current operators does not shift or couple the quantum states of the qubits For example, to transition between the microwave excitation mode and the persistent current mode, the first input flux $\alpha$ is tuned from slightly greater than approximately zero amplitude (to isolate the lowest mode in frequency from the other modes) to a value approximately equal to a first amplitude $\Phi$ corresponding to the superconducting flux quantum. This is implemented while for the third flux $\Delta$ is constant and slightly greater than approximately zero amplitude, as well. For these values of control fluxes, the ground state is adiabatically transformed into the lower energy current state, while the excited state is adiabatically transformed into the higher energy current state. To transition between the persistent current mode and the noise-protected mode, both the second input flux $\gamma$ and the first flux $\alpha$ are adiabatically increased by an approximate $\Phi/2$ flux magnitude. For these values of control flux, the $|0\rangle$ and $|\pi\rangle$ states in the persistent current mode are adiabatically transformed into the $|0\rangle$ and $|\pi\rangle$ states in the noise-protected mode.

These adiabatic transitions allow the Pauli dipoles of voltage and current operators to be transformed between the microwave and current modes, or to be significantly suppressed as the tunable current-mirror qubit 50 transitions to the noise-protected mode. The tunable current-mirror qubit 50 can also be readout using these transitions, similar to as described previously. As an example, the tunable current-mirror qubit 50 can transition from the noise-protected mode to the persistent current mode, and the value of the current can be sensed directly. Thus, the current can be read from the tunable current-mirror qubit 50 in the $|0\rangle$ and $|\pi\rangle$ states. To readout the qubit in the $|+\rangle$ and $|-\rangle$ states, the tunable current-mirror qubit 50 is transitioned from the noise-protected mode to the persistent current mode, then transitioned to the microwave excitation mode to perform a readout (e.g., via an X90 microwave gate) before the tunable current-mirror qubit 50 is dispersively readout.

The methods for preparation and readout of the tunable current-mirror qubit 50 are not limited to as described herein, such that there are other possible methods that can be appreciated based on, for example, physical voltage or current operators acting on the qubit state. Additionally, other physical arrangements of the tunable current-mirror qubit 50 are also possible, such that the tunable current-mirror qubit 50 can be scaled to include any number of flux tunable elements and associated capacitor arrangements.

Figure 3:
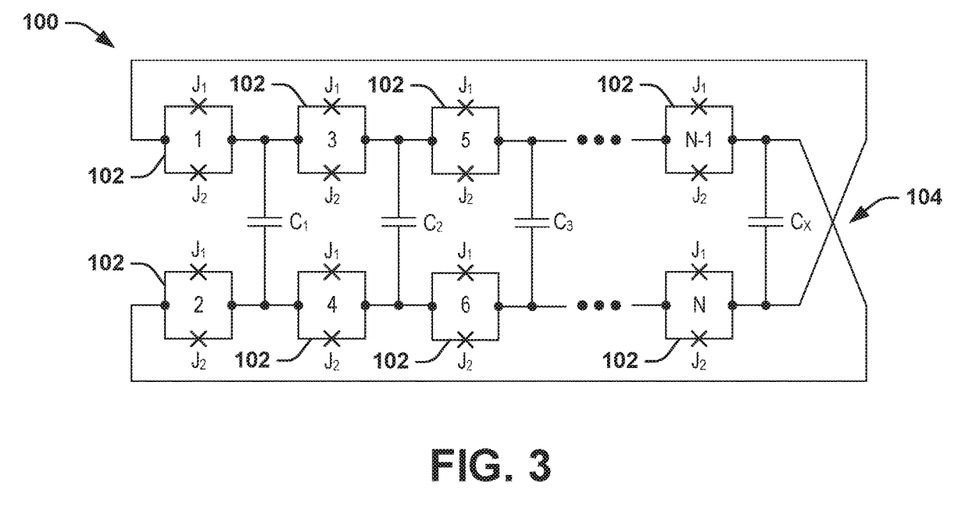
FIG. 3 illustrates another example of a circuit diagram of a tunable current-mirror qubit system.

FIG. 3 illustrates an example of a tunable current-mirror qubit 100. The tunable current-mirror qubit 100 can be implemented in a quantum computer system to manipulate quantum data in the quantum computer system. For example, the tunable current-mirror qubit 100 can correspond to the tunable current-mirror qubit 14 in the example of FIG. 1. Therefore, reference is to be made to the example of FIG. 1 in the following description of the example of FIG. 3.

In the example of FIG. 3, the tunable current-mirror qubit 100 includes a plurality N of SQUIDs 102, where N is a positive integer greater than one, demonstrated as disposed about a circuit loop. The SQUIDs 102 are each demonstrated as including a pair of parallel Josephson junctions $J_1$ and $J_2$. Additionally, the tunable current-mirror qubit 100 includes a plurality X of capacitors, where X is a positive integer greater than one and can be equal to N/2, that interconnect nodes between respective pairs of SQUIDs 102. The arrangement of the SQUIDs 102 and the capacitors $C_1$ through $C_X$ can thus correspond to a Mobius loop, demonstrated based on a twisted section at 104. As an example, the capacitors $C_1$ through $C_X$ can have a relatively large capacitance (e.g., at least 50 femtofarads).

The tunable current-mirror qubit 100 can thus operate substantially the same as the tunable current-mirror qubit 50 in the example of FIG. 2, but is demonstrated as having a potentially much larger quantity of flux tunable elements. Particularly, for example, a respective one of the SQUIDs 102 can receive a first input flux α, while the remaining SQUIDs 102 are configured to receive a second input flux γ, and the circuit loop arrangement of the SQUIDs 102 can receive a third input flux Δ. Accordingly, the input fluxes α, γ, and Δ can be independently controlled to control the mode of the tunable current-mirror qubit 100, such as to allow the tunable current-mirror qubit 100 to transition between at least two modes, as described herein.

Figure 4:
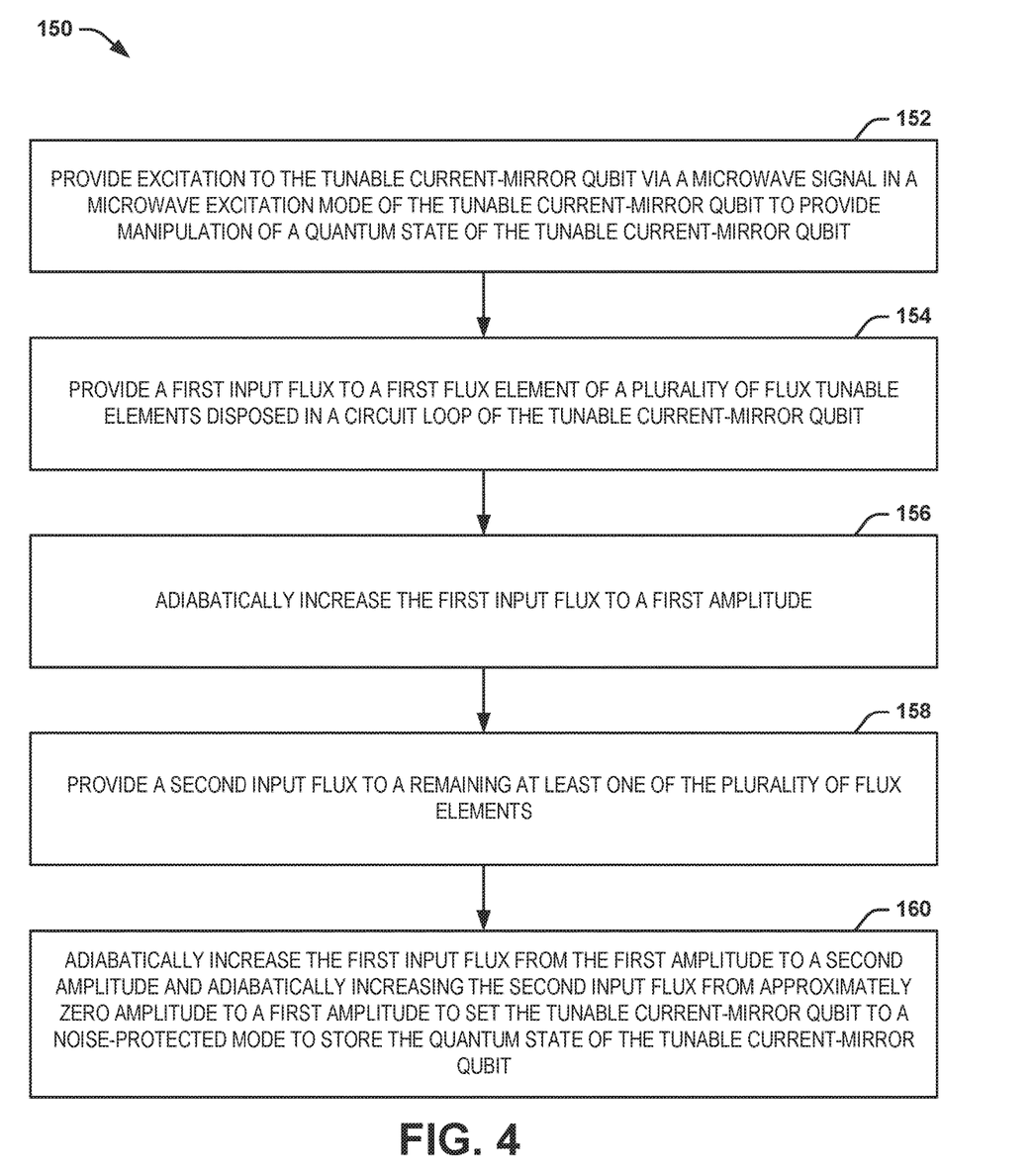
FIG. 4 illustrates an example of a method for controlling a tunable current-mirror qubit.

In view of the foregoing structural and functional features described above, a methodology in accordance with various aspects of the present invention will be better appreciated with reference to FIG. 4. While, for purposes of simplicity of explanation, the methodology of FIG. 4 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for controlling a tunable current-mirror qubit (e.g., the tunable current-mirror qubit 14). At 152, excitation is provided to the tunable current-mirror qubit via a microwave signal (e.g., the microwave excitation MCWE) in a microwave excitation mode of the tunable current-mirror qubit. At 154, a first input flux (e.g., the first input flux α) to a first flux tunable element of a plurality of flux tunable elements (e.g., the flux tunable elements 16) disposed in a circuit loop (e.g., the circuit loop 54) of the tunable current-mirror qubit. The tunable current-mirror qubit can further include a plurality of capacitors (e.g., the capacitors 18) interconnecting nodes between respective pairs of the flux tunable elements to facilitate correlations of Cooper pairs. At 156, the first input flux is adiabatically increased to a first amplitude. At 158, a second input flux (e.g., the second input flux γ) is provided to a remaining at least one of the plurality of flux tunable elements. At 160, the first input flux is adiabatically increased from the first amplitude to a second amplitude and the second input flux is adiabatically increased from approximately zero amplitude to a first amplitude to set the tunable current-mirror qubit to a noise-protected mode to store the quantum state of the tunable current-mirror qubit.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A tunable current-mirror qubit comprising:
a plurality of flux tunable elements coupled between nodes disposed in a circuit loop, a first portion of the flux tunable elements being configured to receive a first input flux and a remaining portion of the flux tunable elements being configured to receive a second input flux to control a mode of the tunable current-mirror qubit between a microwave excitation mode to facilitate excitation or quantum state manipulation of the tunable current-mirror qubit via a microwave input signal and a noise-protected mode to facilitate storage of the quantum state of the tunable current-mirror qubit, wherein the first and second input fluxes are independently provided to control a transition of the tunable current-mirror qubit between the microwave excitation mode and the noise-protected mode; and
at least one capacitor interconnecting the nodes between respective pairs of the flux tunable elements to facilitate formation of Cooper-pair excitons in each of the microwave excitation mode and the noise-protected mode.

2. The qubit of claim 1, wherein each of the plurality of flux tunable elements act as superconducting quantum interference devices (SQUIDs).

3. The qubit of claim 1, wherein the first portion of the flux tunable elements corresponds to a first one of the flux tunable elements that is provided the first input flux from a first input flux source, and wherein the second portion of the flux tunable elements correspond to a remaining at least one of the plurality of flux tunable elements that is provided the second input flux from a second input flux source.

4. The qubit of claim 1, wherein the circuit loop is configured to receive a third input flux that is provided as a static bias flux in the microwave excitation mode and is deactivated in the noise-protected mode.

5. The qubit of claim 1, wherein the plurality of flux tunable elements are arranged about the circuit loop to form a Mobius loop.

6. The qubit of claim 1, wherein the first input flux is adiabatically increased while the second input flux is deactivated to switch the tunable current-mirror qubit from the microwave excitation mode to a persistent current mode in which the relevant quantum states are associated with circulating currents about the circuit loop, wherein the first and second input fluxes are adiabatically increased to switch the tunable current-mirror qubit from the persistent current mode to the noise-protected mode.

7. The qubit of claim 6, wherein the first and second input fluxes are adiabatically decreased to switch the tunable current-mirror qubit from the noise-protected mode to the persistent current mode, and wherein the first input flux is adiabatically decreased while the second input flux is deactivated to switch the tunable current-mirror qubit from the persistent current mode to the microwave excitation mode to facilitate readout of the tunable current-mirror qubit.

8. The qubit of claim 1, wherein the tunable current-mirror qubit implements formation of Cooper-pair excitons that delocalize about the circuit loop in the noise-protected mode.

9. A qubit system comprising the tunable current-mirror qubit of claim 1, the system further comprising a first flux source configured to provide the first input flux and a second flux source configured to provide the second input flux, wherein the first and second flux sources are independently controlled.

10. A method for controlling a tunable current-mirror qubit, the method comprising:
providing excitation to the tunable current-mirror qubit via a microwave signal in a microwave excitation mode of the tunable current-mirror qubit to provide manipulation of a quantum state of the tunable current-mirror qubit;
providing a first input flux to a first flux tunable element of a plurality of flux tunable elements coupled between nodes disposed in a circuit loop of the tunable current-mirror qubit, the tunable current-mirror qubit further comprising at least one capacitor interconnecting the nodes between respective pairs of the flux tunable elements to facilitate formation of Cooper-pair excitons that delocalize about the circuit loop;
adiabatically increasing the first input flux to a first amplitude;
providing a second input flux to a remaining at least one of the plurality of flux tunable elements; and
adiabatically increasing the first input flux from the first amplitude to a second amplitude and adiabatically increasing the second input flux from approximately zero amplitude to a first amplitude to set the tunable current-mirror qubit to a noise-protected mode to store the quantum state of the tunable current-mirror qubit.

11. The method of claim 10, wherein each of the plurality of flux tunable elements act as superconducting quantum interference devices (SQUIDs).

12. The method of claim 10, further comprising providing a third input flux that is provided as a static bias flux in the microwave excitation mode and is deactivated in the noise-protected mode, wherein adiabatically increasing the first and second input fluxes comprises deactivating the third input flux to set the tunable current-mirror qubit to a noise-protected mode to store the quantum state of the tunable current-mirror qubit.

13. The method of claim 10, wherein the plurality of flux tunable elements are arranged about the circuit loop to form a Mobius loop.

14. The method of claim 10, wherein adiabatically increasing the first input flux from approximately zero amplitude to the first amplitude comprises adiabatically increasing the first input flux from approximately zero amplitude to the first amplitude to set the tunable current-mirror qubit from the microwave excitation mode to a persistent current mode in which the ground and first excited states are associated with circulating currents about the circuit loop, wherein adiabatically increasing the first and second input fluxes comprises adiabatically increasing the first and second input fluxes to set the tunable current-mirror qubit from the persistent current mode to the noise-protected mode.

15. The method of claim 10, further comprising:
adiabatically decreasing the first input flux from the second amplitude to the first amplitude and adiabatically decreasing the second input flux from the first amplitude to approximately zero amplitude; and
adiabatically decreasing the first input flux from the first amplitude to approximately zero amplitude and deactivating the second input flux to set the tunable current-mirror qubit to the microwave excitation mode to readout the quantum state of the tunable current-mirror qubit.

16. A tunable current-mirror qubit system comprising:
a first flux source that is controlled to provide a first input flux;
a second flux source that is controlled to provide a second input flux;
a third flux source that is controlled to provide a third input flux; and
a tunable current-minor qubit comprising:
a plurality of superconducting quantum interference devices (SQUIDs) coupled between nodes disposed in a circuit loop that is arranged as a Mobius loop and is configured to receive the third input flux, a first portion of the SQUIDs being configured to receive the first input flux and a remaining portion of the SQUIDs being configured to receive the second input flux, wherein the first, second, and third input fluxes are provided to control the mode of the tunable current-mirror qubit between a microwave excitation mode to facilitate excitation and quantum state manipulation of the tunable current-mirror qubit via a microwave input signal and a noise-protected mode to facilitate storage of the quantum state of the tunable current-mirror qubit; and
at least one capacitor interconnecting the nodes between respective pairs of the SQUIDs to facilitate formation of Cooper-pair excitons that delocalize about the circuit loop in each of the microwave excitation mode and the noise-protected mode.

17. The qubit of claim 16, wherein the first input flux is adiabatically increased while the second input flux is deactivated to switch the tunable current-mirror qubit from the microwave excitation mode to a persistent current mode in which the excitation is converted to a circulating current about the circuit loop, wherein the third input flux is deactivated and the first and second input fluxes are adiabatically increased to switch the tunable current-mirror qubit from the persistent charge mode state to the noise-protected mode.

18. The qubit of claim 17, wherein the first and second input fluxes are adiabatically decreased to switch the tunable current-mirror qubit from the noise-protected mode to the persistent current mode, and wherein the third input flux is activated and the first input flux is adiabatically decreased while the second input flux is deactivated to switch the tunable current-mirror qubit from the persistent current mode to the microwave-excitation mode to facilitate readout of the tunable current-mirror qubit.

19. The qubit of claim 16, wherein the tunable current-mirror qubit implements formation of Cooper excitons that delocalize about the circuit loop in the noise-protected mode.

\* \* \* \* \*